United States Patent
Takagi

(10) Patent No.: US 6,819,729 B2
(45) Date of Patent: Nov. 16, 2004

(54) DIGITAL PLL PULSE GENERATING APPARATUS

(75) Inventor: Kouichi Takagi, Tokyo (JP)

(73) Assignee: Konica Corporation, Tokyo (JP)

( * ) Notice: Subject to any disclaimer, the term of this patent is extended or adjusted under 35 U.S.C. 154(b) by 689 days.

(21) Appl. No.: 09/888,483

(22) Filed: Jun. 25, 2001

(65) Prior Publication Data

US 2002/0006178 A1 Jan. 17, 2002

(30) Foreign Application Priority Data

Jun. 30, 2000 (JP) ........................................ 2000-198602

(51) Int. Cl.$^7$ ................................................ H03D 3/24
(52) U.S. Cl. ........................ 375/376; 375/368; 327/147; 327/156
(58) Field of Search ................................ 375/354, 365, 375/376, 368; 370/503, 517; 327/147, 149, 156, 158

(56) References Cited

U.S. PATENT DOCUMENTS 5,165,089 A * 11/1992 Jaquette et al. ............ 369/59.2
5,327,411 A * 7/1994 Iwasa et al. ............. 369/59.12

OTHER PUBLICATIONS

Cho, J. Digitally controlled PLL with Pulse width Detection Mechanism Error Correction ISSCC 1997.*

* cited by examiner

Primary Examiner—Temesghen Ghebretinsae
(74) Attorney, Agent, or Firm—Frishauf, Holtz, Goodman & Chick, P.C.

(57) ABSTRACT

A digital PLL pulse generator includes a delay-chain section having a plurality of delay elements forming delayed clock signals with different delayed states; a synchronized-signal detecting section to detect a plurality of delayed clock signals, and to output synchronizing information; a pulse forming section to form an output pulse having a desired pulse width and a desired timing by selecting a desired delayed clock signal, based on the synchronizing information and pulse forming information for forming a desired pulse; a feedback section to receive a feedback pulse returned from an external device as a result of loading the output pulse onto the external device, and to detect a phase difference between the feedback pulse and the output pulse; and a correcting section to correct a timing of the output pulse formed by the pulse forming section in response to the detected phase difference.

10 Claims, 8 Drawing Sheets

DIGITAL PLL PULSE GENERATING APPARATUS

BACKGROUND OF THE INVENTION

The present invention relates to digital PLL pulse generating apparatus, and specifically relates to a digital PLL pulse generating apparatus, which make it possible to instantaneously generate digital PLL pulses in a stable mode.

Various kinds of digital circuits require clock signals to drive operations of the circuits. The clock signals have been generated in the apparatus by clock signal generating circuits employing various kinds of methods.

In the almost cases mentioned above, pulse width conditions or timing conditions required by the various kinds of digital circuits cannot be directly derived from the reference clock signals serving as a reference. In general practices, such the pulse width conditions or timing conditions have been obtained from the reference clock signals generated by the clock generating circuit by utilizing the delay time inherently included in the circuit or employing a specific delay element.

With respect to the clock signals, since a conditional range of the clock signals is optimally set depending on the device under operation, it becomes impossible to insure the normal operation of the device, when the conditional range of the clock signals deviates from the optimum range.

Associating with the recent trend of the high-speed processing in the apparatus, the operating velocities of the devices included in the apparatus also have increased, and therefore, the clock frequencies are apt to increase and the optimum ranges of the output pulses required for the devices are apt to become narrow.

The operating environment of the devices included in the apparatus, however, is inherently unstable, and sometimes, fluctuations of physical conditions, such as an output voltage of the power source, a peripheral temperature, humidity, environmental conditions of the elements and wiring in the circuit, etc., would influence the circuit operations. Accordingly, when such the factors influence the circuit, which generates the abovementioned output pulses or processing pulses, the output pulses would be possibly fluctuated.

To cope with the above problem, many kinds of devices, in which inputted clock signals are phase-locked by the PLL circuit (the Phase Locked Loop Circuit) embedded in the integrated circuit to utilize the stable clock signals in the device, have been proposed for this purpose.

However, in the commercialized integrated circuits, such as the ASIC (the Application Specific Integrated Circuit), etc., there have bee problems that a normal operation is not insured in respect to discontinuous clock signals, and/or a feedback loop operated in the IC requires a long setup time.

SUMMARY OF THE INVENTION

To overcome the abovementioned drawbacks in conventional PLL circuits, it is an object of the present invention to provide digital PLL pulse generating apparatus, which make it possible to stably provide pulses having a desired timing.

Accordingly, to overcome the cited shortcomings, the abovementioned object of the present invention can be attained by digital PLL pulse generating apparatus described as follow.

(1) An apparatus for generating a digital PLL pulse, comprising: a delay-chain section having a plurality of delay elements coupled in serial to form a plurality of delayed clock signals, delayed states of which are different relative to each other in respect to reference clock signals; a synchronized-signal detecting section to select a plurality of delayed clock signals out of the delayed clock signals formed by the delay-chain section, and to output synchronizing information being equivalent to a number of delay stages for one period based on the selected delayed clock signals; a pulse forming section to form an output pulse having a desired pulse width and a desired timing by selecting a desired delayed clock signal out of the delayed clock signals formed by the delay-chain section, based on the synchronizing information outputted by the synchronized-signal detecting section and pulse forming information for forming a desired pulse; a feedback section to receive a feedback pulse returned from an external device as a result of loading the output pulse onto the external device, and to detect a phase difference between the feedback pulse and the output pulse; and a correcting section to correct a timing of the output pulse formed by the pulse forming section in response to the phase difference detected by the feedback section.

(2) The apparatus of item 1, further comprising: a memory section to store the phase difference between the feedback pulse and the output pulse; wherein the correcting section corrects a timing of the output pulse so as to cancel the phase difference stored in the memory section.

(3) The apparatus of item 1, wherein a detecting operation for detecting the phase difference between the feedback pulse and the output pulse and a correcting operation for correcting the timing of the output pulse are performed in a time-sharing mode by a single device.

(4) The apparatus of item 1, wherein the apparatus comprises two combinations of the delay-chain section and the synchronized-signal detecting section, and in one of the two combinations, the phase difference between the feedback pulse and the output pulse is detected, while in another one of the two combinations, the timing of the output pulse is corrected based on the phase difference.

(5) An apparatus for generating a digital PLL pulse, comprising: a first delay-chain section having a plurality of delay elements coupled in serial to form a plurality of delayed clock signals, delayed states of which are different relative to each other in respect to reference clock signals; a second delay-chain section having a plurality of delay elements coupled in serial to form a plurality of delayed output pulses, delayed states of which are different relative to each other in respect to output pulses; a first synchronized-signal detecting section to select a plurality of delayed clock signals out of the delayed clock signals formed by the first delay-chain section, and to output first synchronizing information being equivalent to a number of delay stages for one period based on the selected delayed clock signals; a second synchronized-signal detecting section to select the output pulses or a plurality of delayed output pulses, which are synchronized with feedback pulses returned from an external device as a result of loading the output pulses onto the external device, out of the delayed output pulses formed by the second delay-chain section, and to output second synchronizing information being equivalent to a number of delay stages for one period based on the selected delayed output pulses; a pulse forming section to form the output pulses, each of which has a desired pulse width and a desired timing so as to cancel fluctuations of the feedback pulses in respect to the output pulses, by selecting a desired delayed clock signal out of the delayed clock signals formed by the first delay-chain section based on the first synchronizing information, the second synchronizing information and pulse forming information for forming a desired pulse.

(6) The apparatus of item 5, wherein the apparatus also performs an operation for forming the output pulses in parallel so as to cancel fluctuations of the feedback pulses in respect to output of the first synchronizing information, output of the second synchronizing information and the output pulses.

(7) The apparatus of item 5, wherein the second synchronizing information includes a relative state between the reference clock signals and the feedback pulses, and, a relative state between the output pulses and the feedback pulses.

(8) The apparatus of item 1, wherein each of the delay-chain section, the synchronized-signal detecting section, the pulse forming section, the feedback section and the correcting section is integrated into an integrated circuit.

(9) The apparatus of item 1, wherein each of the delay-chain section, the synchronized-signal detecting section, the pulse forming section, the feedback section and the correcting section is a digital circuit.

(10) The apparatus of item 1, further comprising: a CPU (Central Processing Unit) to control each of the delay-chain section, the synchronized-signal detecting section, the pulse forming section, the feedback section and the correcting section.

Further, to overcome the abovementioned problems, other digital PLL pulse generating apparatus, embodied in the present invention, will be described as follow:

(11) A digital PLL pulse generating apparatus, characterized in that, the digital PLL pulse generating apparatus comprises:

a delay-chain section, in which delay elements are coupled in chain-connection to form a plurality of delayed clock signals by delaying reference clock signals;

a synchronized-signal detecting section to select delayed clock signals synchronized with the reference clock signals from the delay-chain section, and to derive synchronizing information being equivalent to a number of delay stages for one period from information of the selected delayed clock signals;

pulse forming means for forming an output pulse having a desired pulse width and a desired timing by selecting desired delayed clock signals from the delay-chain section while referring to the synchronizing information derived by the synchronized-signal detecting section and pulse forming information for forming a desired pulse;

feedback means for detecting a phase difference by comparing the feedback pulse with the output pulse formed by the pulse forming means; and correcting means for correcting a timing of the output pulse formed by the pulse forming means in response to the phase difference detected by the feedback means.

(12) The digital PLL pulse generating apparatus, cited in item 11, characterized in that, the correcting means comprises a memory section to store the phase difference between the feedback pulse and the output pulse and corrects a timing of the output pulse so as to cancel the phase difference stored in the memory section.

(13) The digital PLL pulse generating apparatus, cited in item 11 or item 12, characterized in that, a detecting operation for detecting the phase difference due to the feedback and a correcting operation for correcting the timing of the output pulse in response to the detected phase difference are performed in a time-sharing mode by the same device

(14) The digital PLL pulse generating apparatus, cited in item 11 or item 12, characterized in that, the digital PLL pulse generating apparatus comprises two systems of the delay-chain sections and synchronized-signal detecting sections, and performs a detecting operation for detecting the phase difference due to the feedback and a correcting operation for correcting the timing of the output pulse in response to the detected phase difference in parallel.

(15) A digital PLL pulse generating apparatus, characterized in that, the digital PLL pulse generating apparatus comprises:

a first delay-chain section, in which delay elements are coupled in chain-connection to form a plurality of delayed clock signals;

a second delay-chain section, in which delay elements are coupled in chain-connection to form a plurality of delayed clock signals or a plurality of delayed feedback pulses a first synchronized-signal detecting section to select delayed clock signals synchronized with the reference clock signals from the first delay-chain section, and to derive first synchronizing information being equivalent to a number of delay stages for one period from information of the selected delayed clock signals;

a second synchronized-signal detecting section to select delayed clock signals synchronized with either the output pulses or feedback pulses from the second delay-chain section, and to derive second synchronizing information being equivalent to a number of delay stages for one period from information of the selected delayed clock signals; and pulse forming means for forming an output pulse having a desired pulse width and a desired timing so as to cancel fluctuations of the feedback pulses, by selecting necessary delayed clock signals from the delay-chain section while referring to the first synchronizing information derived by the first synchronized-signal detecting section, the second synchronizing information derived by the second synchronized-signal detecting section and pulse forming information for forming a desired pulse.

(16) The digital PLL pulse generating apparatus, cited in item 15, characterized in that, the digital PLL pulse generating apparatus performs in parallel the deriving operation of the first synchronizing information, the deriving operation of the second synchronizing information and the forming operation of the output pulses to cancel fluctuations of the feedback pulses.

(17) The digital PLL pulse generating apparatus, cited in item 15 or item 16, characterized in that, the second synchronizing information derived by the second synchronized-signal detecting section includes a state between the reference clock signals and the feedback pulses, and, a state between the output pulses and the feedback pulses.

(18) The digital PLL pulse generating apparatus, cited in any one of items 11–17, characterized in that, each of the sections is structured by an integrated circuit.

(19) The digital PLL pulse generating apparatus, cited in any one of items 11–18, characterized in that, each of the sections is structured by a digital circuit.

(20) The digital PLL pulse generating apparatus, cited in any one of items 11–19, characterized in that, the pulse forming means is controlled by a CPU (Central Processing Unit).

According to the digital PLL pulse generating apparatus of the present invention, cited in items 11–20, by reselecting clock signals depending on the feedback result after generating the objective processing pulses by selecting from a plurality of clock signals, it becomes possible to improve a response time from starting the phase comparing operation to obtaining output pulses having a desired timing.

In other words, by performing the feedback operation in a digital processing mode, it becomes possible to stably provide pulses having a desired timing, irrespective of various kinds of variable factors.

Further, according to the digital PLL pulse generating apparatus of the present invention, cited in items 11–13, since a plurality of time-shared operations are performed by a single circuit system, it becomes possible to simplify the circuit configuration.

Still further, according to the digital PLL pulse generating apparatus of the present invention, cited in items 14–16, since two operations are performed in parallel by two circuit systems, it becomes possible to real-timely perform the compensating operation by applying the feedback.

Still further, since the digital PLL pulse generating apparatus, embodied in the present invention, works in the digital processing mode, it is suitable for being integrated into an integrated circuit, as described in item 18.

Still further, since the digital PLL pulse generating apparatus, embodied in the present invention, works in the digital processing mode, it is suitable for being structured by digital circuits, as described in item 19.

Still further, since the digital PLL pulse generating apparatus, embodied in the present invention, works in the digital processing mode, it is suitable for being structured to be controlled by a CPU, as described in item 20.

BRIEF DESCRIPTION OF THE DRAWINGS

Other objects and advantages of the present invention will become apparent upon reading the following detailed description and upon reference to the drawings in which.

DETAILED DESCRIPTION OF THE PREFERRED EMBODIMENT

Figure 1:
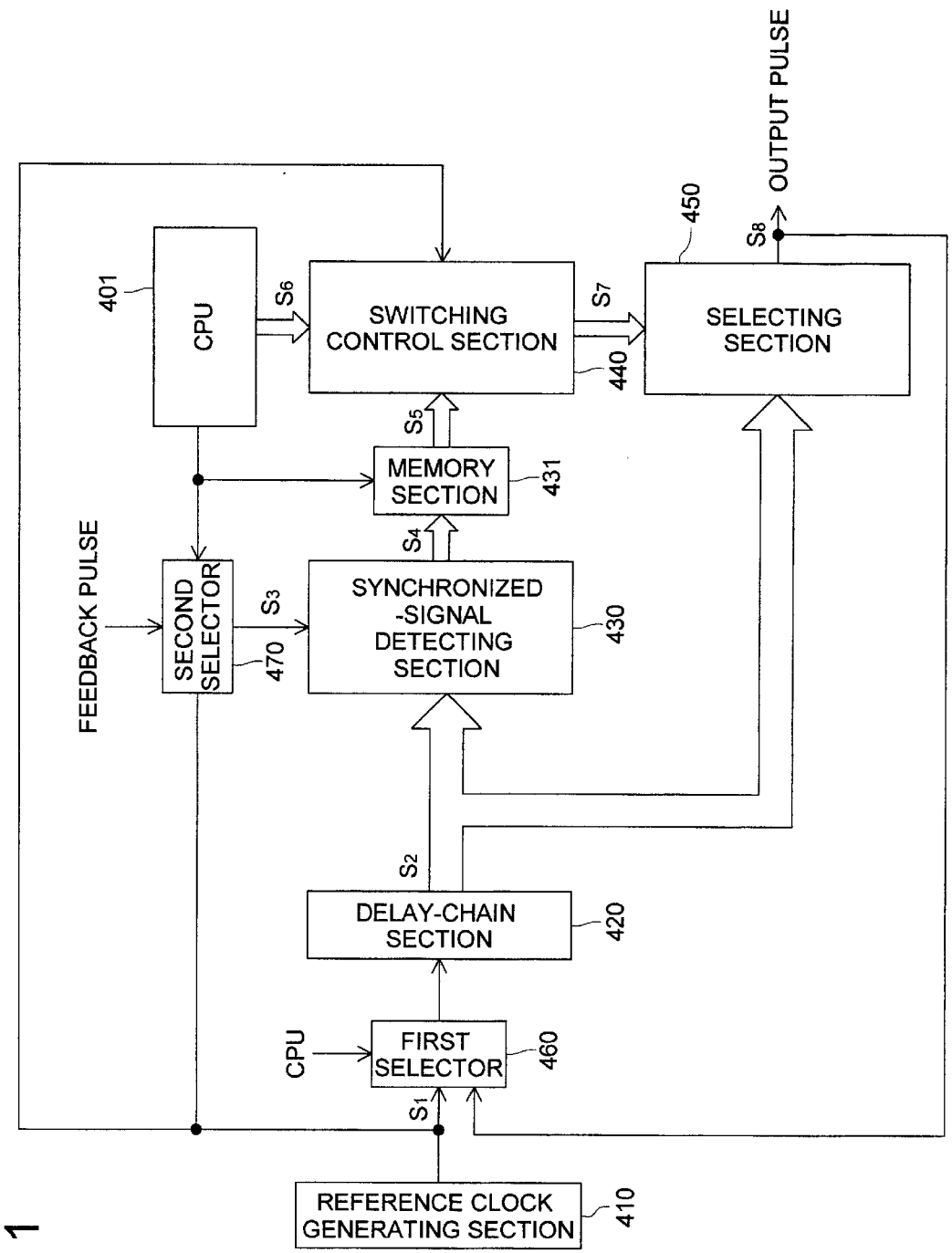
FIG. 1 shows a block diagram of a clock generating apparatus embodied in the present invention, indicating an overall electronic configuration of the first embodiment.

Referring to the drawings, the digital PLL pulse generating apparatus, embodied in the present invention, will be detailed in the following.

[First Embodiment]

In FIG. 1, CPU 401 serves as a control section for controlling overall operations of the clock generating apparatus. Incidentally, CPU 401 performs fundamental control actions of the frequency and timings of the output pulses.

Reference clock generating section 410 generates a clock signal (a reference clock signal: $S_1$ in FIG. 1), serving as a reference signal.

Figure 2:
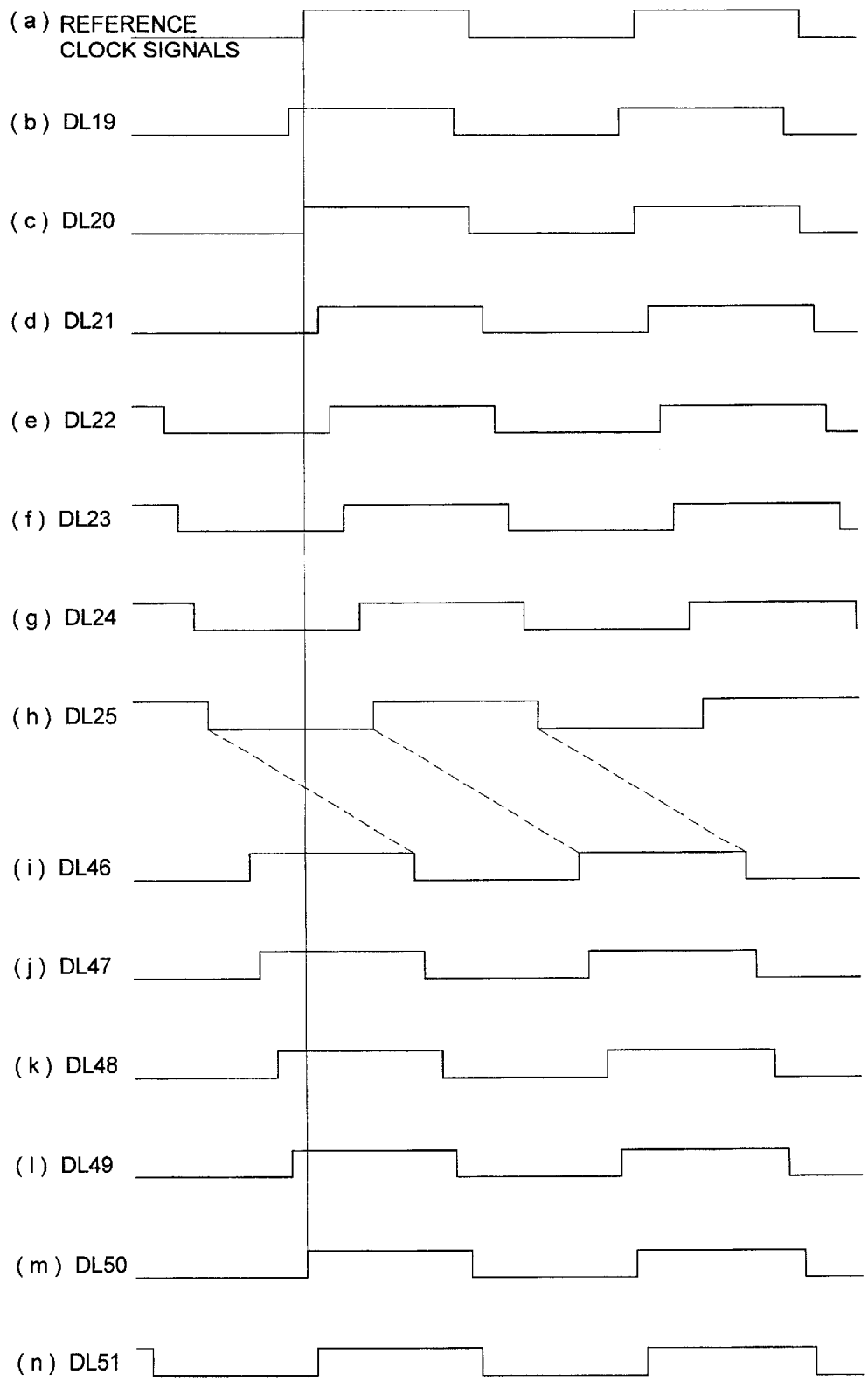
FIG. 2 shows a time-chart for explaining operations of a clock generating apparatus of the first embodiment.

Delay-chain section 420, serving as a clock forming section, is a group of delay elements for delaying the inputted signal (the reference clock signal outputted from reference clock generating section 410) to obtain a plurality of delayed clock signals (a plurality of clock signals: S2 in FIG. 1, refer to FIG. 2), phases of which are slightly different relative to each other.

Incidentally, it is desirable that the delay elements are cascaded as a chain in such a number of stages that the delayed clock signals, phases of which are slightly different relative to each other, can be formed over two period of the reference clock, and each of the delayed clock signals can be outputted from each of the delay elements. Further, it is also desirable that an inverting logic circuit is coupled to the both input and output of each of the delay elements to minimize the disorder of the duty-cycle. In addition, it is also desirable to layout the delay elements so as to equalize the output intervals between the delay elements as fine as possible.

Further, although the delay elements are employed fro forming the delayed clock signals in the above embodiment, it is also applicable to employ a clock generating section, which can form a plurality of clock signals having different phases each other without using delay elements.

Still further, when a plurality of clock generating apparatus are employed in an apparatus, it is applicable that reference clock generating section 410 is incorporated in each of the clock generating apparatus, or it is also applicable that reference clock signals are distributed to each of the clock generating apparatus from reference clock generating section 410, serving as a single clock generating section.

Still further, in the first embodiment, during the feedback operation, delay-chain section 420 receives the pulses ($S_8$ in FIG. 1) outputted by the apparatus through selector 460, and delays the pulses with the delay elements.

During the normal operation, synchronized-signal detecting section 430 detects a number of stages of the delayed clock signals (synchronized points), which are synchronized with the reference clock (the leading edge position of the desired input signal) included in a plurality of clock signals ($S_2$ in FIG. 1), and outputs the synchronized information. Incidentally, the synchronized information is also referred to as the phase difference state, and the synchronized information (the phase difference state) includes the synchronized point information and the state of phase difference itself (the phase difference state), detailed later.

Further, it is desirable that, during the normal operation, synchronized-signal detecting section 430 can receives the reference clock sent through selector 470, and can output first synchronized point information $V_{1st}$, which is initially synchronized with the reference clock, second synchronized point information $V_{2nd}$, which is secondary synchronized with the reference clock, and delay stage number $V_{prd}$, which indicates a number of delayed stages between $V_{1st}$ and $V_{2nd}$, ($S_4$ in FIG. 1), from a plurality of clock signals ($S_2$ in FIG. 1). In the example shown in FIG. 2, it is established that first synchronized point information $V_{1st}$=20, second synchronized point information $V_{2nd}$=50 and delay stage number $V_{prd}$=30.

Still further, during the feedback operation, synchronized-signal detecting section 430 receives feedback pulses sent from the external apparatus through selector 470 (for instance, output pulses of a state including transmission fluctuations arising from a variation of circuit elements caused by connecting the formed output pulses to the objective load, physical variations of a wiring length, etc., environmental variations of output voltage of the power source, peripheral temperature, humidity, etc.), and the pulses ($S_8$ in FIG. 1) outputted by the apparatus through delay-chain section 420, to output feedback-synchronized point information $V_{fb}$ ($S_4$ in FIG. 1), which indicates a delay state of the feedback pluses. Namely, during the feedback operation, synchronized-signal detecting section 430 serves as a feedback device.

Incidentally, to detect a number of stages synchronized with the reference clock as mentioned above, flip-flop circuits, into which adjacent output signals of delay-chain section 420 are inputted, are employed for detecting a logic inverting position of adjacent input signals.

In other words, each of the flip-flop circuits are coupled to each of delayed signals outputted from delay-chain section 420, and a logic circuit for detecting more than one position, at which logic states of adjacent output signals among a plurality of the delayed signals are different relative to each other, is employed, and the same clock signals or the same arbitral signals are inputted into all of the flip-flop circuits, and a value (a number of delay stages) of the position, at which the logic states are different each other, is utilized as the delay information.

Memory section 431 stores an error difference component between the synchronized point information of the normal time and the synchronized point information of the feedback time, and outputs a compensated synchronized point information at the normal time by utilizing the error difference component ($S_5$ in FIG. 1), namely, memory section 431 serves as a correcting device.

Switching control section 440 outputs the selected stage number information ($S_7$ in FIG. 1) for selecting a clock signal having a desired phase from a plurality of clock signals ($S_2$ in FIG. 1), to form a desired output pulse by creating a rise transient and a fall transient of the clock at desired timings (at predetermined times), based on the reference clock ($S_1$ in FIG. 1) sent from reference clock generating section 410, the synchronized point information ($S_5$ in FIG. 1) sent from synchronized-signal detecting section 430 and memory section 431, and the shift information ($S_6$ in FIG. 1: "the pulse forming information" in claims) sent from CPU 401. Incidentally, "the shift information", which is sent from CPU 401 to switching control section 440, includes, for instance, the information being peculiar to each apparatus in which the clock generating apparatus embodied in the present invention is incorporated, the information being peculiar to every use of the pulses outputted from the clock generating apparatus, etc., namely, the signals, such as $CPU_{mode}$, $CPU_{data}$, $CPU_{adjust}$, etc., are included in the shift information.

Selecting section 450 receives the select-stage information from switching control section 440 to select a specific clock signal having desired rise and fall transients out of a plurality of clock signals ($S_2$ in FIG. 1), and forms the output pulses ($S_8$ in FIG. 1) having a desired pulse width and a desired timing based on the selected clock signal.

Figure 3:
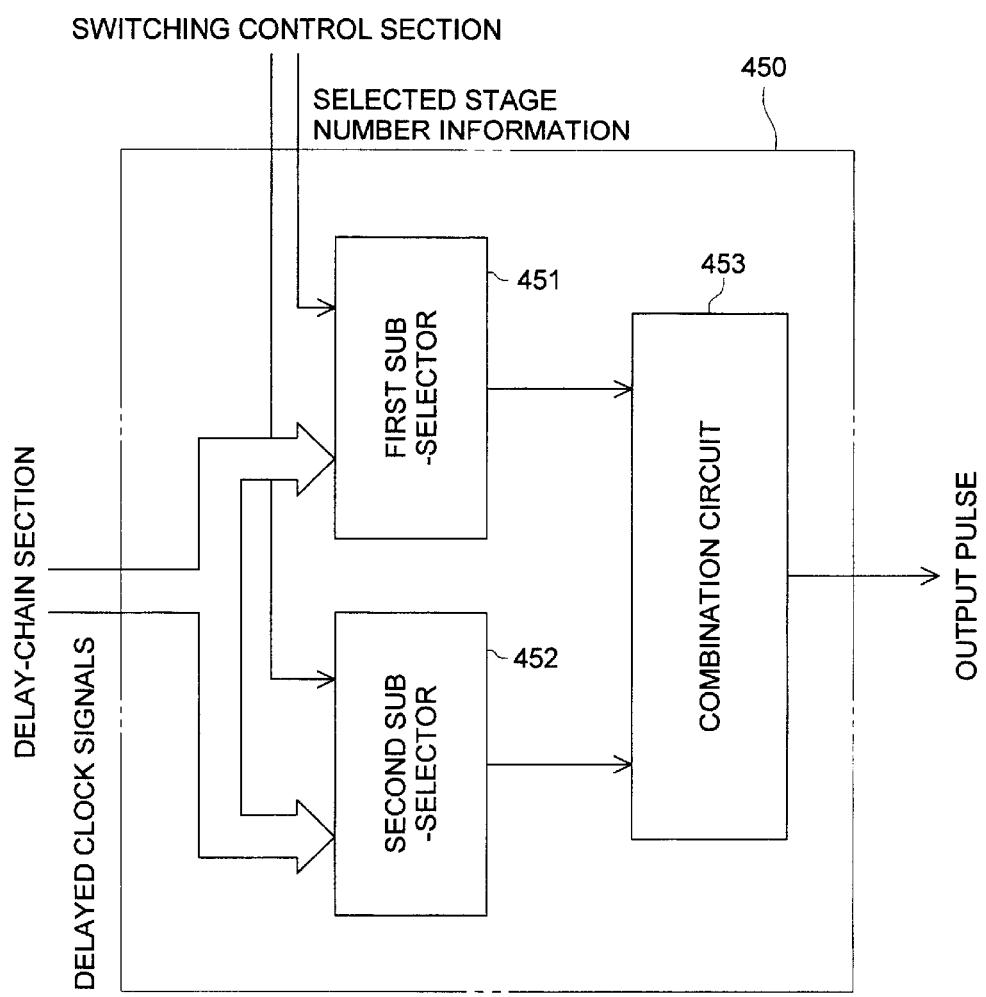
FIG. 3 shows a block diagram of a main section of a clock generating apparatus embodied in the present invention, indicating a electronic configuration of the first embodiment.

Incidentally, as shown in FIG. 3, selecting section 450 comprises first sub-selector 451 to select a clock signal having a desired rise transient, second sub-selector 452 to select a clock signal having a desired fall transient, and combination circuit 453 including logic circuits (AND, OR, NAND, NOR, ExOR, ExNOR, etc.) to form a desired output pulse with the selected clock signal having the desired rise transient and the selected clock signal having a desired fall transient.

Under the controlling actions of CPU 401, during the normal operation, first selector 460 feeds the reference clock signals ($S_1$ in FIG. 1) sent from reference clock generating section 410 to delay-chain section 420, while during the feedback operation, first selector 460 feeds the output pulses ($S_8$ in FIG. 1) fed back from the output port to delay-chain section 420.

Under the controlling actions of CPU 401, during the normal operation, second selector 470 feeds the reference clock signals sent from reference clock generating section 410 to synchronized-signal detecting section 430, while during the feedback operation, second selector 470 feeds the feedback pulses sent from the external apparatus to synchronized-signal detecting section 430.

Figure 4:
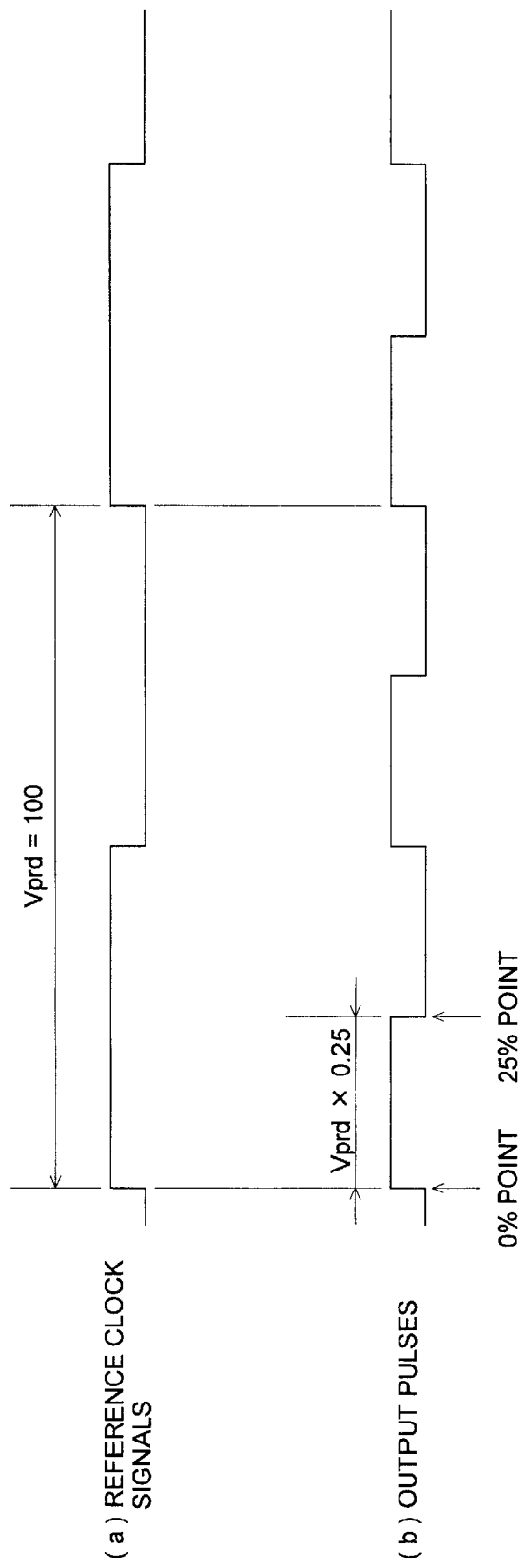
FIG. 4 shows a time-chart for explaining operations of a clock generating apparatus of the first embodiment.

FIG. 4 shows a time-chart, indicating an operating state of switching control section 440 during the normal operation. To simplify the following explanation, it is assumed that the aforementioned delay stage number $V_{prd}$=100, as shown in line (a) of FIG. 4.

Further, it is also assumed that the desired output pulse, shown in line (b) of FIG. 4, is a pulse, which rises at the time of $V_{prd} \times 0$, and falls at the time of $V_{prd} \times 0.25$, and, as a result, has a period of 25% of the reference clock signal.

In this case, switching control section 440 outputs $F_{sync1}$=0+100×0=0

$F_{sync2}$=0+100×0.25=25, as selected stage number information ($S_7$ in FIG. 1), to selecting section 450.

Further, considering that the selected stage number information may vary in response to changes of a source voltage, an environmental temperature, etc., it is desirable that the values of $V_{prd}$, $V_{1st}$, $V_{2nd}$, etc. are periodically revised at arbitral intervals.

Further, with respect to the values of $F_{sync1}$ and $F_{sync2}$, it is possible to set a mode of directly writing $F_{sync1}$ and $F_{sync2}$ from CPU 401 ($CPU_{data} \rightarrow F_{sync1}, F_{sync2}$) or to set a mode of conducting the plus/minus adjustment ($F_{sync} \pm CPU_{adjust}$), etc., based on the shift information sent from CPU 401. With respect to the above CPU modes, since the first embodiment is a digital PLL circuit, it becomes possible to arbitrarily set the abovementioned modes.

As mentioned above, during the normal operation, the output pulse ($S_8$ in FIG. 1), having a desired pulse width and a desired timing, can be formed by selecting desired rise and fall transients out of a plurality of delayed clock signals created by delaying the reference clock signals ($S_1$ in FIG. 1).

Figure 5:
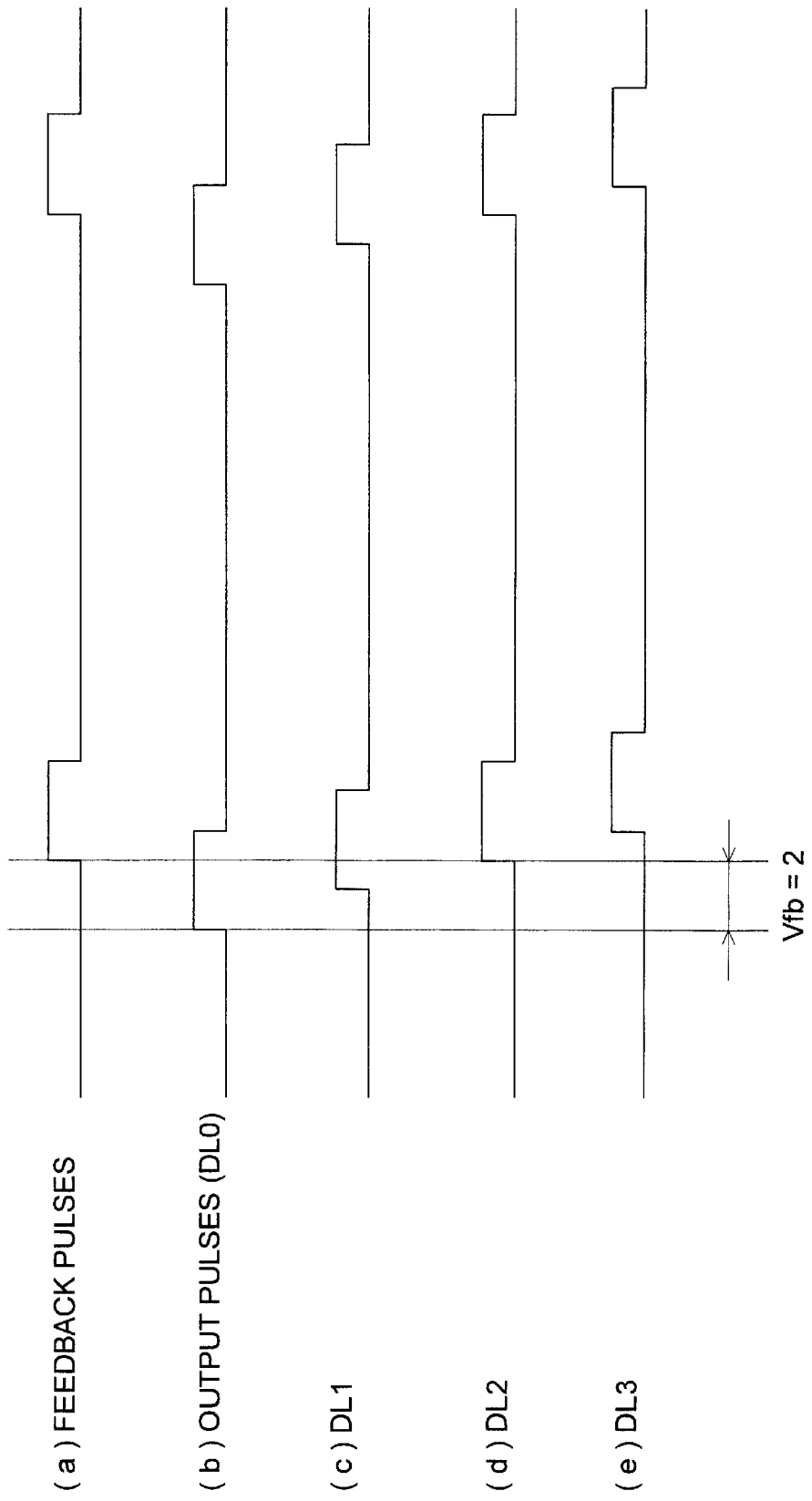
FIG. 5 shows a time-chart for explaining operations of a clock generating apparatus of the first embodiment.

FIG. 5 shows a time-chart of various delayed states of the feedback pulses, indicating a process of forming feedback-synchronized point information $V_{fb}$. In the block diagram shown in FIG. 1, during feedback operation, delay-chain section 420 receives the output pulses ($S_8$ in FIG. 1) passed through first selector 460 and delay elements included in delay-chain section 420 delays the received output pulses. While, the feedback pulses are pass through second selector 470 as well, and thereby, synchronized-signal detecting section 430 outputs a synchronizing state between the feedback pulse, shown in line (a) of FIG. 5, and the delayed signals of the output pulse, shown in line (b)–(d) of FIG. 5, as feedback-synchronized point information $V_{fb}$ indicating the delayed state of the feedback pulse. In the case shown in FIG. 5, since the feedback pulse, shown in line (a) of FIG. 5, is synchronized with delayed signal DL2, it is established that $V_{fb}$=+2. During the feedback operation, memory section 431 memorizes feedback-synchronized point information $V_{fb}$=+2.

Figure 6:
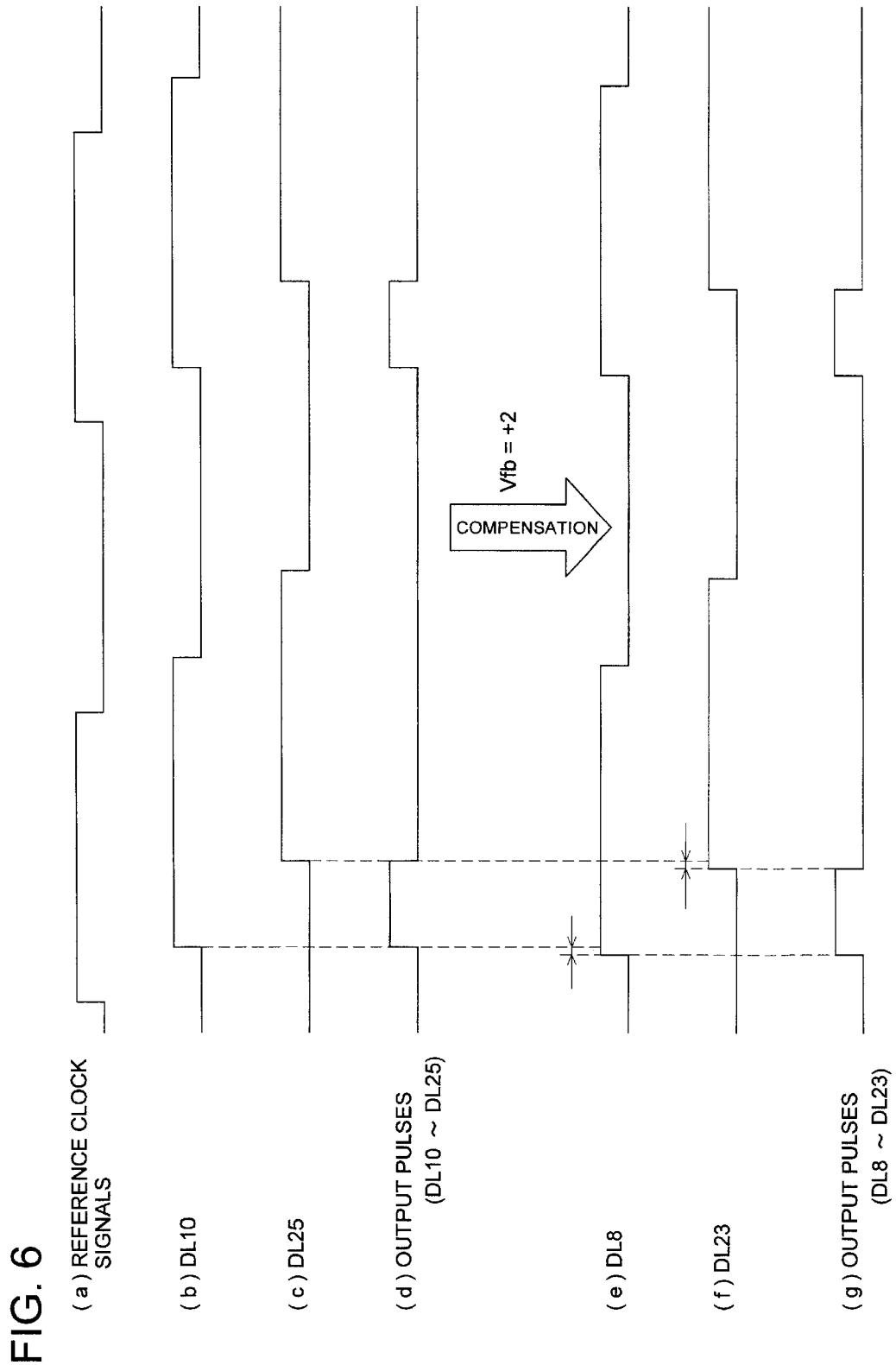
FIG. 6 shows a time-chart for explaining operations of a clock generating apparatus of the first embodiment.

FIG. 6 shows a time-chart of the output pulses, indicating a correcting operation performed by employing feedback-synchronized point information $V_{fb}$. Lines (a)–(d) of FIG. 6 indicate a process of forming the output pulse by using DL 10-DL 25, the process being performed before the feedback operation. Since, during the feedback operation, memory section 431 memorizes $V_{fb}$=+2, and during the normal operation after the feedback operation, switching control section 440 compensates $V_{fb}$=+2, the selected stage number information for selecting DL 8 and DL 23 is outputted to selecting section 450. Accordingly, selecting section 450 selects DL 8 and DL 23 to form output pulses of DL 8-DL 23. In the above case, since $V_{fb}$ is set at +2, the compensating operation is performed so as to set back the delayed clock signal at two stages.

According to the above operation, transmission fluctuations, etc., arising from a variation of circuit elements caused by connecting the output pulses to the objective load, physical variations of a wiring length, etc. and environmental variations of output voltage of the power source, peripheral temperature, humidity, etc., can be compensated. Accordingly, it becomes possible to provide constant pulses necessary for digital PLL pulse generating apparatus, regardless of various kinds of variable factors.

Incidentally, CPU 401 can arbitrarily establish a time and an interval for performing the abovementioned feedback operation.

According to the abovementioned embodiment, it is possible to cope with one, in which the clock frequency is high and an optimum range of the output pulses required by these devices is narrowed. In addition, the output pulses do not fluctuate, even if physical conditions of circuit elements and wiring environment, output voltage of the power source, peripheral temperature, humidity, etc. are varies.

Further, since the abovementioned embodiment is a digital PLL circuit instead of an analogue PLL circuit, it is expected to maintain a normal operation even when discontinuous clock signals are inputted, and it can be settled in a stable operation within a setup time of several clock signals.

Figure 8:
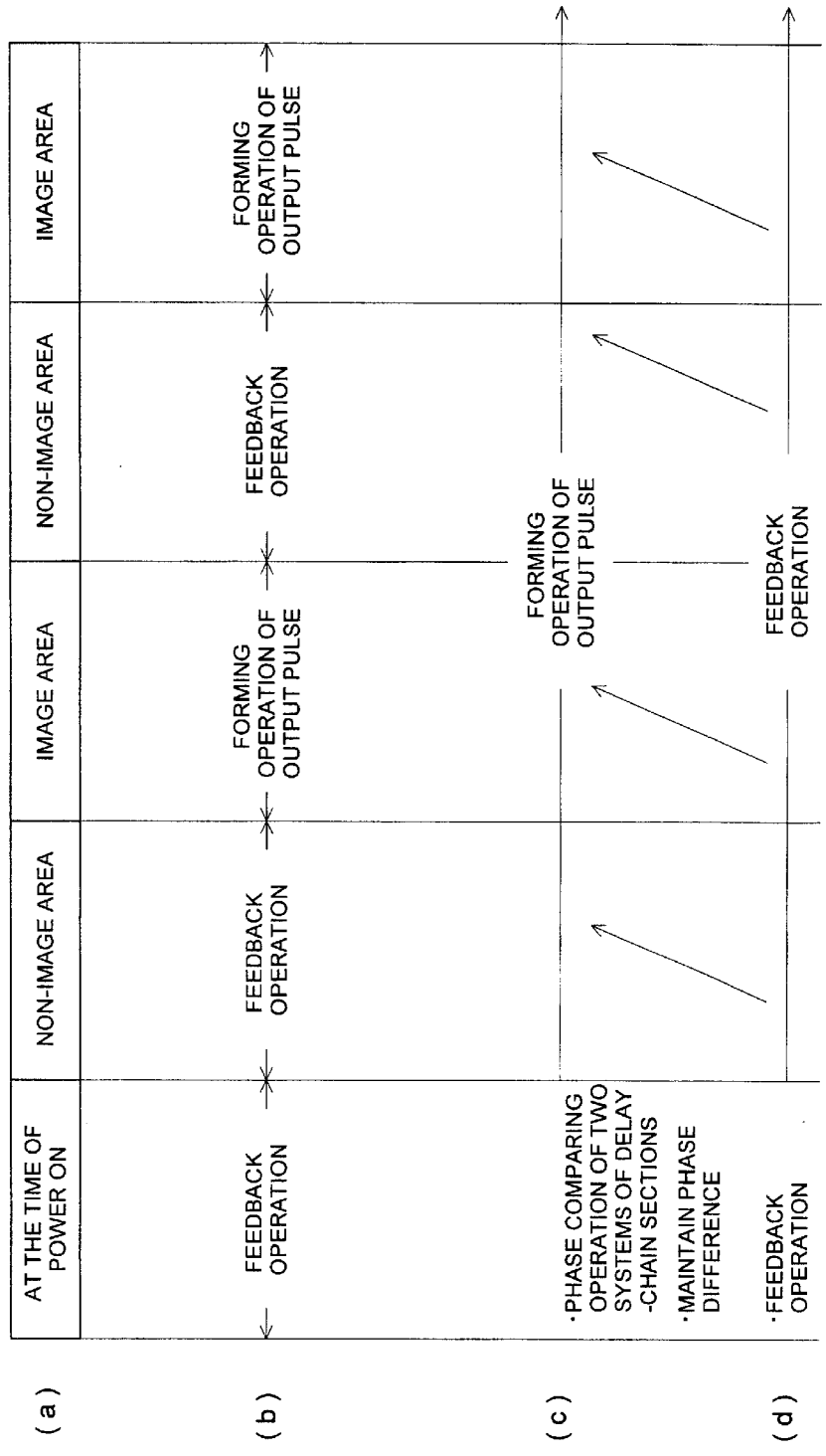
FIG. 8 shows a time-chart, indicating operation states of a clock generating apparatus embodied in the present invention.

Still further, in the first embodiment, the feedback operation and the phase correcting operation are time-shared in the same circuit (refer to line (b) of FIG. 8). When the embodiment of the present invention is applied to image-forming apparatus, etc., the feedback operation can be performed at the non-image area, resulting in a simplification of the circuit configuration as an advantage.

Still further, although the configuration, in which selecting section 450 forms a single output pulse, is stated in the descriptions referring with FIG. 1, it is also possible to form and output a plurality of output pulses by employing a plurality of selecting sections.

Still further, since each section of the first embodiment described in the above is a digital circuit, it can be suitably integrated into an integrated circuit. In addition, it is desirable that the CPU in respect to pulse generating operations controls each section of the first embodiment.

[Second Embodiment]

Figure 7:
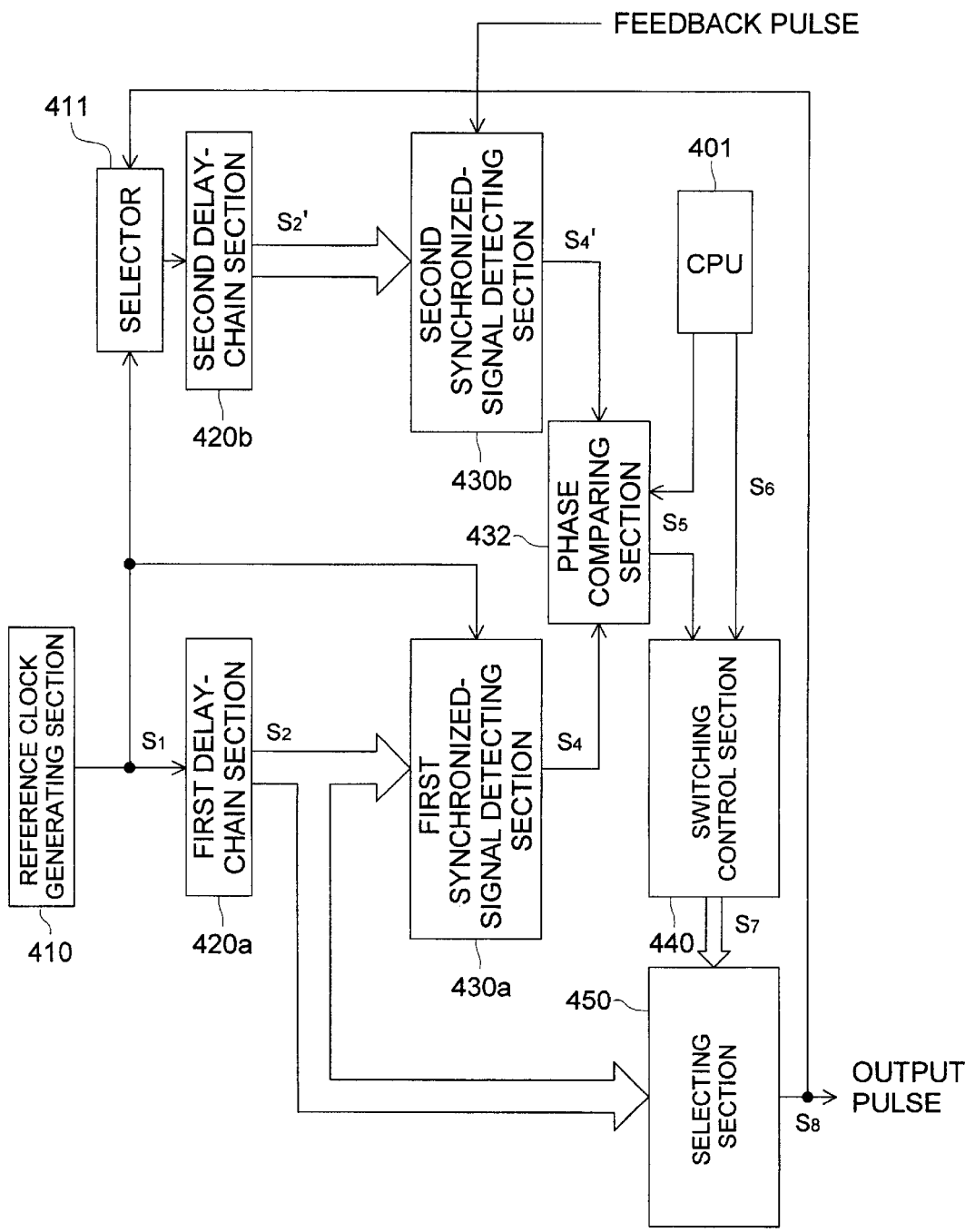
FIG. 7 shows a block diagram of a clock generating apparatus embodied in the present invention, indicating an overall electronic configuration of the second embodiment.

FIG. 7 shows a block diagram of the configuration of the second embodiment of the present invention. In FIG. 7, the same reference number is attached to the same matter as that in FIG. 1.

The second embodiment is characterized in that two systems of the delay-chain section and the synchronized-signal detecting section are provided in a single configuration.

Concretely speaking, in first delay-chain section 420a and first synchronized-signal detecting section 430a, a plurality of delayed clock signals ($S_2$ in FIG. 7) are formed by delaying the reference clock signals ($S_1$ in FIG. 7), and the output pulse ($S_8$ in FIG. 7), having a desired pulse width and a desired timing, are formed by selecting desired rise and fall transients while referring to the synchronizing-state ($S_4$: the first synchronizing information in FIG. 7).

On the other hand, in second delay-chain section 420b and second synchronized-signal detecting section 430b, just after the power source is turned ON, the reference clock signals ($S_1$ in FIG. 7), which is selected by selector 411 under the controlling actions of CPU 401, is inputted, in order to form the synchronizing-state ($S_4'$: the second synchronizing information in FIG. 7) in respect to a plurality of delayed clock signals ($S_2'$ in FIG. 7) obtained by delaying the reference clock signals ($S_1$ in FIG. 7).

In other words, just after the power source is turned ON, phase comparing section 432 compares the synchronizing-state ($S_4$: the first synchronizing information in FIG. 7) of first delay-chain section 420a with the synchronizing-state ($S_4'$: the second synchronizing information in FIG. 7) of second delay-chain section 420b, so as to detect and memorize phase difference $V_{diff}$ between two systems of delay-chain sections (lines (c) and (d): at the time when the power source is turned ON).

Then, during the normal operation, the output pulses are fed into second delay-chain section 420b through selector 411, and in second delay-chain section 420b and second synchronized-signal detecting section 430b, the feedback operation with the feedback pulses and the output pulses is continuously performed to obtain feedback-synchronized point information $V_{fb}$ (refer to line (c) in FIG. 8).

Further, during the normal operation, in first delay-chain section 420a and first synchronized-signal detecting section 430a, delayed clock signals are continuously formed by delaying the reference clock signals to obtain the normal-synchronized point information (refer to line (d) in FIG. 8)

In the mean time, phase comparing section 432 compensates the normal-synchronized point information ($V_{1st}$, $V_{2nd}$, $V_{prd}$) by referring to phase difference $V_{diff}$, between two systems of delay-chain section, found in advance and feedback-synchronized point information $V_{fb}$ sent from second synchronized-signal detecting section 430b, and feeds the compensated-synchronized point information to switching control section 440. Then, the desired output pulses are obtained through the same process as described referring to FIG. 1.

In the second embodiment, after the phase comparing operation between two systems of delay-chain sections is performed at the time when the power source is turned ON, the feedback operation and the normal operation are shared in the two systems and preformed in parallel (a parallel processing). As a result, the repetition between the feedback operation and the normal operation, performed in the first embodiment, is no longer necessary. Accordingly, it becomes possible to perform the continuous and stable operation in the real-time mode.

According to the abovementioned embodiment, it is possible to cope with one, in which the clock frequency is high and an optimum range of the output pulses required by these devices is narrowed. In addition, the output pulses do not fluctuate, even if physical conditions of circuit elements and wiring environment, output voltage of the power source, peripheral temperature, humidity, etc. are varies.

Further, since the abovementioned embodiment is a digital PLL circuit instead of an analogue PLL circuit, it is expected to maintain a normal operation even when discontinuous clock signals are inputted, and it can be settled in a stable operation within a setup time of several clock signals.

Still further, since each section of the second embodiment described in the above is a digital circuit, it can be suitably integrated into an integrated circuit. In addition, it is desirable that the CPU in respect to pulse generating operations controls each section of the first embodiment.

As detailed in the above, according to the present invention, by performing the digital feedback operation, it becomes possible to stably provide pulses having a desired timing.

Disclosed embodiment can be varied by a skilled person without departing from the spirit and scope of the invention.

What is claimed is:

1. An apparatus for generating a digital PLL pulse, comprising:

a delay-chain section having a plurality of delay elements coupled in serial to form a plurality of delayed clock signals, delayed states of which are different relative to each other in respect to reference clock signals;

a synchronized-signal detecting section to select a plurality of delayed clock signals out of said delayed clock signals formed by said delay-chain section, and to output synchronizing information being equivalent to a number of delay stages for one period based on said selected delayed clock signals;

a pulse forming section to form an output pulse having a desired pulse width and a desired timing by selecting a desired delayed clock signal out of said delayed clock signals formed by said delay-chain section, based on said synchronizing information outputted by said synchronized-signal detecting section and pulse forming information for forming a desired pulse;

a feedback section to receive a feedback pulse returned from an external device as a result of loading said output pulse onto said external device, and to detect a phase difference between said feedback pulse and said output pulse; and a correcting section to correct a timing of said output pulse formed by said pulse forming section in response to said phase difference detected by said feedback section.

2. The apparatus of claim 1, further comprising:

a memory section to store said phase difference between said feedback pulse and said output pulse;

wherein said correcting section corrects a timing of said output pulse so as to cancel said phase difference stored in said memory section.

3. The apparatus of claim 1, wherein a detecting operation for detecting said phase difference between said feedback pulse and said output pulse and a correcting operation for correcting said timing of said output pulse are performed in a time-sharing mode by a single device.

4. The apparatus of claim 1, wherein sa id apparatus comprises two combinations of said delay-chain section and said synchronized-signal detecting section, and in one of said two combinations, said phase difference between said feedback pulse and said output pulse is detected, while in another one of said two combinations, said timing of said output pulse is corrected based on said phase difference.

5. An apparatus for generating a digital PLL pulse, comprising:

a first delay-chain section having a plurality of delay elements coupled in serial to form a plurality of delayed clock signals, delayed states of which are different relative to each other in respect to reference clock signals;

a second delay-chain section having a plurality of delay elements coupled in serial to form a plurality of delayed output pulses, delayed states of which are different relative to each other in respect to output pulses;

a first synchronized-signal detecting section to select a plurality of delayed clock signals out of said delayed clock signals formed by said first delay-chain section, and to output first synchronizing information being equivalent to a number of delay stages for one period based on said selected delayed clock signals;

a second synchronized-signal detecting section to select said output pulses or a plurality of delayed output pulses, which are synchronized with feedback pulses returned from an external device as a result of loading said output pulses onto said external device, out of said delayed output pulses formed by said second delay-chain section, and to output second synchronizing information being equivalent to a number of delay stages for one period based on said selected delayed output pulses;

a pulse forming section to form said output pulses, each of which has a desired pulse width and a desired timing so as to cancel fluctuations of said feedback pulses in respect to said output pulses, by selecting a desired delayed clock signal out of said delayed clock signals formed by said first delay-chain section based on said first synchronizing information, said second synchronizing information and pulse forming information for forming a desired pulse.

6. The apparatus of claim 5, wherein said apparatus also performs an operation for forming said output pulses in parallel so as to cancel fluctuations of said feedback pulses in respect to output of said first synchronizing information, output of said second synchronizing information and said output pulses.

7. The apparatus of claim 5, wherein said second synchronizing information includes a relative state between said reference clock signals and said feedback pulses, and, a relative state between said output pulses and said feedback pulses.

8. The apparatus of claim 1, wherein each of said delay-chain section, said synchronized-signal detecting section, said pulse forming section, said feedback section and said correcting section is integrated into an integrated circuit.

9. The apparatus of claim 1, wherein each of said delay-chain section, said synchronized-signal detecting section, said pulse forming section, said feedback section and said correcting section is a digital circuit.

10. The apparatus of claim 1, further comprising:

a CPU (Central Processing Unit) to control each of said delay-chain section, said synchronized-signal detecting section, said pulse forming section, said feedback section and said correcting section.

* * * * *